United States Patent [19]

Bulger et al.

[11] 4,344,223

[45] Aug. 17, 1982

[54] MONOLITHIC HYBRID INTEGRATED CIRCUITS

[75] Inventors: Gary A. Bulger, Coplay; Lyle D. Heck, Reading; Robert D. Huttemann, Wescosville; Joseph M. Morabito, Bethlehem; Raymond C. Pitetti, Wescosville, all of Pa.; Burton A. Unger, Berkeley Heights, N.J.; Donald J. Vallere, Reading, Pa.

[73] Assignees: Western Electric Company, Inc., New York, N.Y.; Bell Telephone Laboratories, Incorporated, Murray Hill, N.J.

[21] Appl. No.: 210,730

[22] Filed: Nov. 26, 1980

[51] Int. Cl.$^3$ .......................................... H01L 21/18
[52] U.S. Cl. .................................. 29/577 C; 29/591; 204/15; 204/192 SP
[58] Field of Search ............... 29/577 C, 591; 204/15, 204/192 SP

[56] References Cited

U.S. PATENT DOCUMENTS

| | | | |
|---|---|---|---|
| 3,430,334 | 3/1969 | Douta et al. | 29/577 R |
| 3,607,679 | 9/1971 | Melroy et al. | 204/15 |
| 3,616,282 | 10/1971 | Bodway | 204/15 |
| 3,718,565 | 2/1973 | Pelletier | 204/192 R |
| 3,988,824 | 11/1976 | Bodway | 204/38 A |
| 3,997,411 | 12/1976 | Muenz | 204/115 |
| 4,251,326 | 2/1981 | Arcidiacono et al. | 204/15 |

*Primary Examiner*—G. Ozaki
*Attorney, Agent, or Firm*—Lester H. Birnbaum

[57] ABSTRACT

A method of fabricating a thin film semiconductor hybrid circuit is disclosed. After processing of the integrated circuit in the semiconductor wafer up to the point of establishing ohmic contacts (14) to devices (13), a thin film RC circuit is fabricated on an insulating layer (11,12) overlying the wafer. This is accomplished by first forming the capacitor anodes (15′) on the insulator by depositing and etching a layer such as alpha tantalum. Resistors (16) are then formed by depositing and etching a layer such as tantalum nitride. Portions of the capacitor anodes are then anodized using an appropriate mask (17) to form the capacitor dielectric. Capacitor counterelectrodes (20′) and interconnect conductors (20′′′) are formed by depositing and etching successive layers of metal such as nickel-chromium and gold. After all thin film components are formed, the resistors and capacitors are stabilized by heating the circuit in an atmosphere comprising high pressure steam.

12 Claims, 9 Drawing Figures

MONOLITHIC HYBRID INTEGRATED CIRCUITS

BACKGROUND OF THE INVENTION

This invention relates to the fabrication of hybrid integrated circuits, and in particular to a method of forming a thin film circuit on an insulator overlying a semiconductor wafer which includes active semiconductor devices.

At the present time, hybrid integrated circuits are used in a number of applications requiring precision circuit operation. Such circuits are typically fabricated by forming thin film resistors, capacitors, interconnect metal and bonding pads on an insulating substrate such as ceramic. Resistors are typically defined from a layer of tantalum nitride and capacitors typically comprise an anode of tantalum, a dielectric of tantalum oxide, and a counter electrode of nickel-chromium and gold. Interconnect metal is usually a multi-layer of titanium, palladium, and gold or nickel-chromium and gold. (See, for example, U.S. Pat. No. 3,607,679, issued to Melroy, and U.S. Pat. Application of Arcidiacono et al, Ser. No. 974,162, filed Dec. 28, 1978 now U.S. Pat. No. 4,251,326 and assigned to Western Electric Co.) Silicon integrated circuit chips are then bonded to appropriate pads on the substrate. After fine-tuning the thin film components, the hybrid circuit is complete.

Although such circuits perform adequately, it has been recognized that circuit fabrication could be far more economical if the thin film and semiconductor processing could be combined on a single substrate. Various proposals have been made for the marriage of silicon IC and tantalum thin film technologies. (See, e.g., U.S. Pat. No. 3,430,334, issued to Douta et al.).

However, until now, a commercially viable method had not been discovered due to the basic incompatibility of the processing requirements of the two technologies and the need for making the thin film components as small as possible to save semiconductor material. For example, capacitor reliability was a particular problem since the capacitor dielectric had to be thin and high temperature resistor stabilization tended to cause leakage of such capacitors. Further, choice of particular materials for the components, interconnects, etchants, as well as the order of fabrication steps had significant effects on the reliability of components. Removing the grid network necessary for capacitor anodization was also a problem, as well as complete removal of photoresist between beam lead contacts. These and a host of other problems confounded attempts to produce a commercially attractive monolithic circuit.

It is therefore a primary object of the invention to provide a method of forming thin film components over a semiconductor substrate including active devices, which method is compatible with the semiconductor devices and still results in reliable, precise thin film components.

SUMMARY OF THE INVENTION

This and other objects are achieved in accordance with the invention which is a method for fabricating thin film resistor and capacitor components on an insulating layer formed over a semiconductor substrate where said substrate includes semiconductor devices formed therein and ohmic contacts to said devices. Capacitor anodes are first defined on said insulating layer from a first metal layer. A layer of resistive material is then deposited over the structure and resistors defined by etching. A mask and an anodization interconnect pattern are formed by depositing a second metal layer over the structure and etching selected areas. The capacitor dielectric is then formed by anodization in an electrolyte at a low voltage. After removal of the second metal layer, the capacitor counter electrode and a second interconnect pattern are formed by depositing a third metal and etching selected areas. The resistors and capacitors are stabilized by heating the resulting structure in an atmosphere comprising steam at a high pressure.

BRIEF DESCRIPTION OF THE DRAWING

These and other features of the invention are delineated in detail in the following description. In the drawing.

It will be appreciated that for purposes of illustrations these figures are not necessarily drawn to scale.

DETAILED DESCRIPTION

The invention will be described with reference to the fabrication of a portion of a hybrid integrated circuit shown in FIGS. 1-7. For illustrative purposes, these figures show fabrication of a thin film resistor and capacitor coupled in series with a transistor formed within the semiconductor wafer. It will be appreciated that the actual circuit includes many more thin film and semiconductor elements and the use of these figures is not meant to limit the invention to any particular circuit design.

Figure 1:
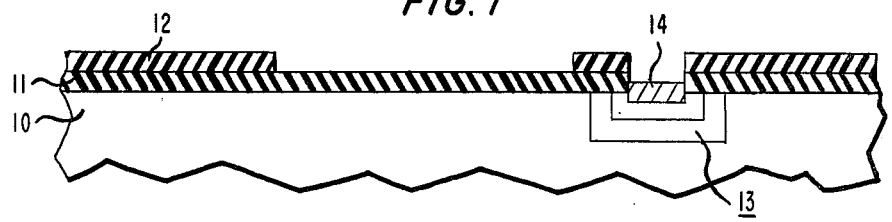
FIGS. 1-7 are cross-sectional views of a portion of a hybrid integrated circuit showing various stages of fabrication in accordance with one embodiment of the invention.

Fabrication of the circuit begins with standard silicon IC processing well known in the art up to the point indicated in FIG. 1 where there is illustrated a portion of a semiconductor wafer, 10, which includes an active device, 13, in this case a standard bipolar transistor. Formed over most of the semiconductor wafer was a first insulating layer, 11, in this case $SiO_2$. Formed over most of this layer was a second insulating layer, 12, comprising $Si_3N_4$ in this example. Windows were etched in the layers so that ohmic contact could be made to the semiconductor devices. In accordance with standard practice, the contact, 14, was fabricated by applying a thin layer of Pt and heating to form a platinum silicide alloy. The second insulating layer was also etched in the areas where the resistors were to be fabricated. The reason for this was that resistors formed on $SiO_2$ showed better aging characteristics than these formed on $Si_3N_4$. However, it may be desirable in some cases to form the resistors on $Si_3N_4$, and the invention is therefore not limited to formation of resistors on $SiO_2$. Etching was accomplished by standard photolithographic techniques.

Figure 2:
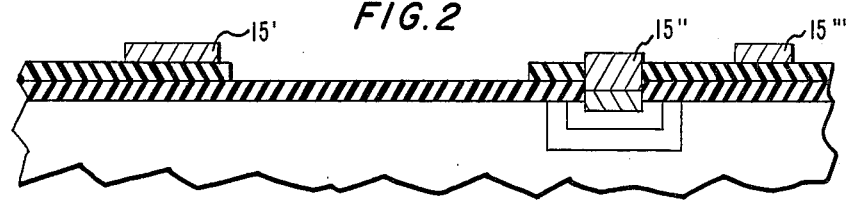

Next, as shown in FIG. 2, a layer, 15, comprising alpha tantalum was deposited over the entire substrate and then etched into a desired pattern. The layer was deposited by standard reactive RF sputtering to a thickness of approximately 3400 Angstroms and with a nitrogen concentration of approximately 14 percent. In general, the thickness of the layer will be within the range 3000–4000 Angstroms and the nitrogen concentration within the range 13–20 percent. Other standard methods of deposition can be employed such as planar magnetron sputtering. This layer performs essentially three functions in the circuit when properly defined. Portion 15' serves as the capacitor bottom electrode and provides an anchor for a beam lead, portion 15''' provides another anchor for a beam lead, and portion 15'' protects the platinum silicide contacts during subsequent processing. The layer was etched with an etchant of 5:1:3:3 $H_2O:HNO_3:CH_3COOH:HF$ using standard photolithographic techniques to produce the portions illustrated in FIG. 2. Other etchants which could be used include combinations of $HNO_3$ and HF of varying concentrations. Plasma etching could also be used employing for example, $CF_4$ as the etchant and small amounts of $O_2$ to vary the etch rate.

Next, a layer of a resistive material, in this case comprising tantalum nitride, was deposited over essentially the entire structure. Again, reactive RF sputtering was used, but other methods of deposition may be employed. In this example, the layer was approximately 200 Angstroms thick to achieve a sheet resistance of 200 ohms/□ as deposited. Typically, the thickness will fall within the range 200–400 Angstroms to attain sheet resistances in the range 100–200 ohms/□ as deposited. For resistances outside this range, thicknesses outside the above range may be employed, and thicknesses in the range 100–1000 Angstroms may generally be used. Again, the layer was etched using standard photolithographic techniques, except that here the etching was performed by a plasma etching process. In a typical example, the etching chamber was evacuated to a pressure of ½ Torr and raised to a temperature of 50–80 degrees C. The etching gas comprised $CF_4$ and the plasma was generated by applying an RF signal of 13.5 MHz and a power of 150 watts. Wet chemical etchants, for example, a 10:5:3:1 $H_2O:HNO_3:CH_3COOH:HF$ solution may be used.

Figure 3:
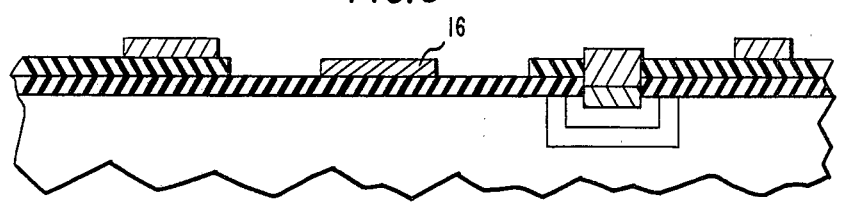

As illustrated in FIG. 3, the etching step defined the appropriate resistor geometry, 16, in the area not covered by the $Si_3N_4$ layer 12. In this particular case, a simple bar geometry is shown, but other resistor shapes such as ladders, top hats and loops may be generated. The resistor also includes appropriate enlarged portions on the edges to facilitate making electrical contact thereto.

Figure 4:
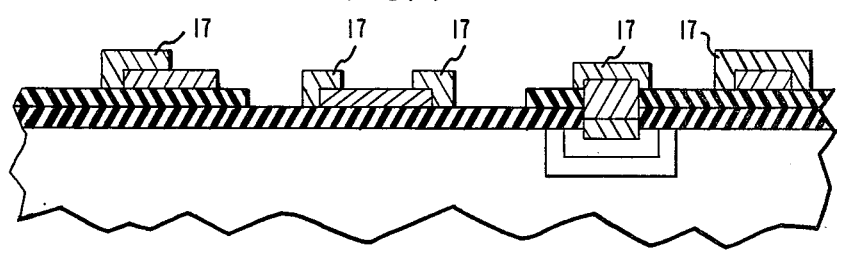
Figure 8:
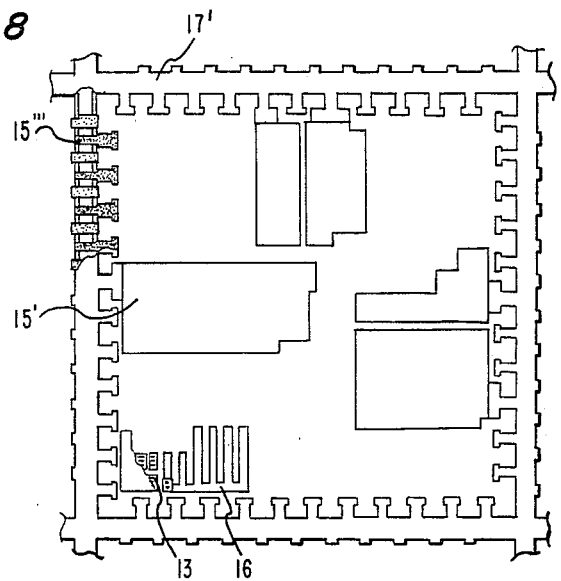
FIG. 8 is a plan view of a portion of a hybrid integrated circuit during one stage of fabrication in accordance with the same embodiment.

Next, a third metal layer, 17, was deposited over essentially the entire structure and the pattern shown in FIG. 4 was generated. In this example, the metal layer was titanium which was deposited to a thickness of approximately 1,000 Angstroms by planar magnitron sputtering. Other techniques can be employed such as RF sputtering and evaporation. The layer will primarily serve as a mask in the subsequent capacitor anodization step and so the thickness of the layer will depend on the anodization voltage and soak time. For a 50 volt anodization, a recommended range is 500–2000 Angstroms. Etching was effected using a standard photoresist and an etchant comprising a 100:1 solution of $H_2O:HF$ to produce the geometry shown in FIG. 4. It will be noted that all areas of the alpha tantalum pattern which are not to be oxidized are protected by the titanium layer. In addition, the contact areas of the resistor are also protected from incidental oxidation from the ambient (since the resistor at this point is floating, it will not be oxidized from the anodization step). If desired, the photoresist layer can be left on the titanium layer to reduce the current drawn by the mask during anodization. The titanium layer also serves the function of providing a bus bar for interconnecting the various capacitors on the substrate during anodization. This is illustrated in the plan view of FIG. 8 which shows a partially completed test circuit with elements corresponding to FIGS. 1–4 similarly numbered. The titanium layer covers the beam anchors (15'''), a small portion of the capacitor electrodes 15', the resistor contact area and substantially all of the silicon devices, 13. A portion (17') of the titanium layer also constitutes the bus bar for electrical interconnection between the five capacitor electrodes shown.

The capacitors were then anodized by immersing the circuit in an aqueous solution comprising 0.01 percent phosphoric acid and including a tantalum foil as a cathode. A positive voltage of approximately 50 volts was applied to the tantalum electrodes through the titanium interconnect metal for a period of approximately 35 minutes. This produced a layer (18 of FIG. 5) of $Ta_2O_5$ approximately 800 Angstroms thick on the exposed portions of the alpha tantalum. Typically, the area of the dielectric was approximately 1 mm×1 mm. An important feature of the method is the use of low voltage anodization to produce very thin dielectrics. This permits fabrication of small size capacitors and consequent saving in the area of semiconductor covered. Preferably, the anodization voltage should be in the range 40–100 volts resulting in a dielectric thickness in the range 600–1600 Angstroms.

Figure 5:
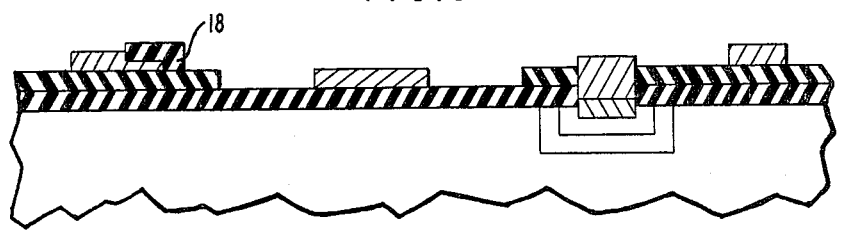

The anodization mask was then stripped off to produce the structure shown in FIG. 5. If a photoresist is used on top of the titanium, the former can be removed by applying a standard photoresist remover solution such as toluene sulfonic acid O-dichlorobenzene perchlorethylene which is sold under the trademark Ecostrip by Allied Chemical Company. The titanium (and a titanium oxide formed thereon during anodization) was removed by applying a 95 percent sulfuric acid solution heated to approximately 125 degrees C. It was found that this etchant will remove the titanium and its oxide without affecting the tantalum and its oxide. Further, since the titanium does not lift off during anodization, fine line definition of the dielectric is obtained. The stripping also removes the titanium bus bar interconnect pattern shown in FIG. 8. The use of a metal anodization mask therefore saves a masking step which would be required for removal if a tantalum interconnect pattern were formed for anodization. (For a detailed discussion of the use of a titanium mask for selective anodization, see, U.S. Patent Application of R. D. Huttemann, Ser. No. 210,731, filed on an even date herewith and incorporated by reference herein.)

Figure 6:
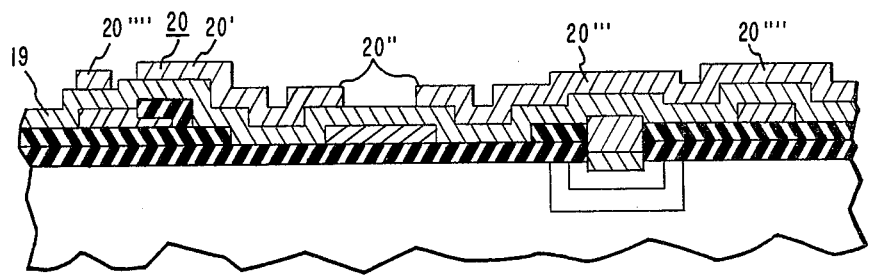

Next, the metallization for capacitor counter electrodes, resistor contacts and interconnection between the thin film components and the semiconductor devices was formed. In this example, as illustrated in FIG. 6, such metallization included a thin layer (approximately 500 Angstroms) of nickel-chromium, 19, and a layer, 20, of gold approximately 13,000 Angstroms formed thereon over essentially the entire substrate. Both layers were formed by standard electron beam evaporation, but other methods may be suitably employed. The thickness of the nickel-chromium layer is typically 500–1000 Angstroms while the gold layer is typically 10,000–15,000 Angstroms thick to achieve a Shelt resistance of 0.03 ohms/□ or less. Thicknesses outside this range may be employed for different conductivity requirements. Other conductor layers may be employed, but it is believed that this combination is particularly suitable for capacitor and interconnect requirements.

The gold layer, 20, was then etched to define the capacitor counter electrode 20', the resistor contacts 20", the interconnect metal 20''' and the beam leads 20'''' as illustrated in FIG. 6. Again, the pattern was defined photolithographically, but this time using an etchant comprising a solution of 300 gms KI and 65 gms $I_2$ dissolved in 100 mil of $H_2O$ which will not affect the underlying nickel-chromium layer. Other etchants could be employed. In this particular example, beam lead contacts were then formed so that electrical contact can be made to the circuit from outside circuitry. If desired, bonding pads may be formed instead for standard wire bonding to outside circuitry. In such cases, the nichrome and gold layers can be etched simultaneously.

Beam leads were formed by covering the entire circuit with photoresist except for the areas of gold which will comprise the beams. Approximately 12 μm of additional gold was then plated on the exposed areas utilizing the nichrome layer for current conduction to produce the beams designated by 22 in FIG. 7. A standard plating operation was performed utilizing potassium, gold and cyanide. The photoresist was then stripped by again applying a solution of Ecostrip.

Figure 7:
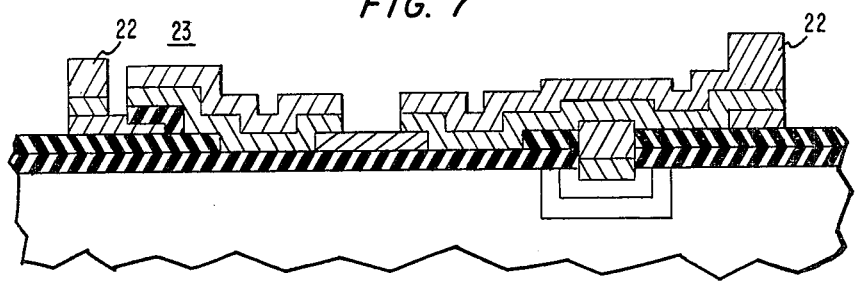

Next, using the gold as a mask, the exposed portions of the nickel-chromium layer 19 were removed to complete definition of the beams, counter electrodes and interconnections as illustrated in FIG. 7. An etchant comprising 85 percent HCL at 50 degrees C. was utilized although other etchants may be employed. The completed capacitor is designated by the numeral 23 in the Figure.

After the components and the necessary metallization were formed, the resistors were stabilized in a manner which did not significantly degrade capacitor leakage. This was accomplished by heating the circuit in an atmosphere comprising steam at a high pressure. In this particular example, the circuits were heated to a temperature of approximately 275 degrees C. for approximately one hour in a steam atmosphere which produced a pressure of approximately 820 psi in a sealed oxidation bomb. This resulted in a change in resistance of no greater than 0.2 percent when resistors were subsequently aged at 135 degrees C. for 2,000 hours (which extrapolates to less than 0.2 percent for 20 years at 65 degrees C.).

In general, for best results, it is recommended that stabilization be performed at the lowest temperature and time possible for insuring a change in resistance of no greater than 50 percent during stabilization while keeping capacitor leakage no greater than 2 Amp/FD. It is recommended that stabilization be performed at temperatures in the range 250–350 degrees C. for times of ½ to 2 hours and steam pressures of 700–1200 psi. (For a more detailed discussion of stabilization in a steam atmosphere, see, U.S. Patent Application of Keller, Morabito and Pitetti filed on Ser. No. 194,881 Oct. 7, 1980 and incorporated by reference herein.)

After the components and interconnections were formed, the circuit was fine-tuned by laser trimming the resistors. A commercially available Q-switched YAG laser trimmer sold by Electro Scientific Industries under the designation Model 44 with a 1.064 μm emission was utilized. The laser was operated in the $TEM_{00}$ mode with a peak power of 4 mw, a pulse width of 170 nanoseconds, and a repetition rate of 1 kHz.

It should be appreciated that trimming resistors on oxide or nitride layers over silicon involves interference effects due to reflections from the dielectric surfaces which are not present when resistors are formed over ceramic. In particular, the beam intensity in the resistor can be enhanced or attenuated depending on the thickness of the underlying insulating layer. In order to use minimum laser power and thereby prevent excessive heating of the silicon substrate, it is recommended that the thickness of the insulating layer and the power of the laser be chosen to provide constructive interference in the tantalum nitride layer. In this particular example, such an effect was achieved with an insulator thickness of 8800 Angstroms and a power of 4 mw. In general, it is recommended that the insulator thickness be in the range 7500–10,000 Angstroms and the power of the pulse fall within the range 4–10 mw.

Figure 9:
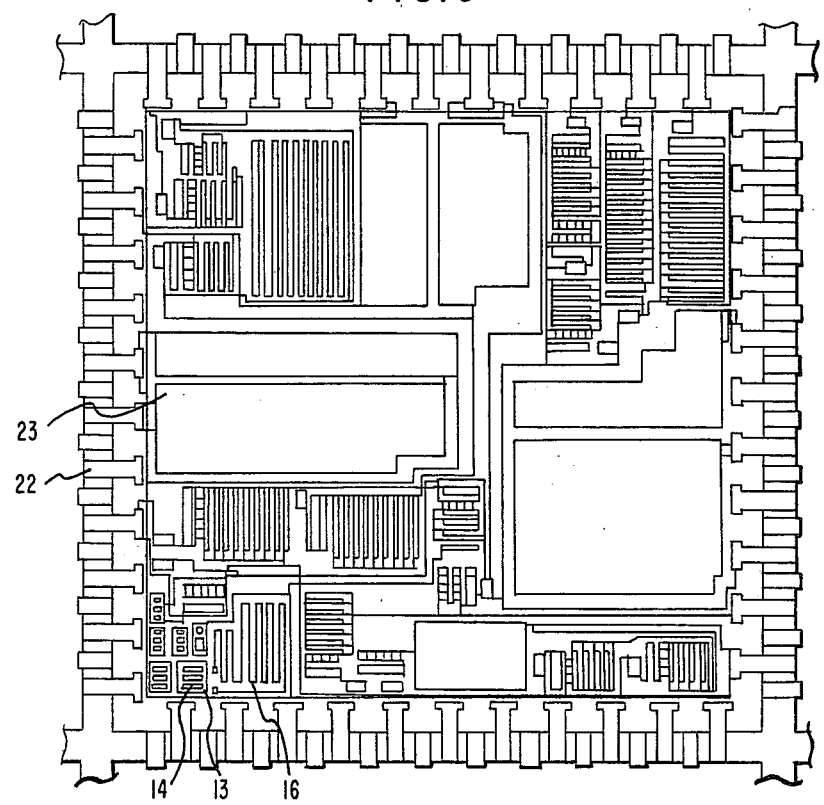
FIG. 9 is a plan view of a completed hybrid integrated circuit in accordance with one embodiment of the invention.

After the above processing, the semiconductor wafer can then be separated into individual circuit chips in accordance with standard semiconductor practice. An example of one hybrid circuit chip prior to separation fabricated in accordance with the invention is illustrated in the plan view of FIG. 9. Illustrative elements corresponding to those in FIGS. 1–7 are similarly numbered. The chip area was 3360 μm × 3360 μm. It will be appreciated that this particular circuit is shown for illustrative purposes only and the invention is not limited to this particular design.

It should be understood that in the following claims the terms "insulating layer" and "metal layer" are intended to be broad enough to include plural layers.

Various modifications of the described process will become apparent to those skilled in the art. All such variations which basically rely on the teachings through which the invention has advanced the art are properly considered within the spirit and scope of the invention.

I claim:

1. A method for fabricating thin film resistor (16) and capacitor (23) components on an insulating layer (11,12) formed over a semiconductor substrate (10) where said substrate includes semiconductor devices (13) formed therein and ohmic contacts (14) to said devices characterized in the steps of defining a capacitor anode (15') selectively on said insulating layer from a first metal layer; depositing a layer of resistive material over the resulting structure and defining a resistor (16) in a selected area; forming a mask (17) and a first interconnect pattern (17') for selective oxidation of the capacitor anode by depositing a second metal layer and etching selected areas; forming a dielectric (18) on the capacitor anode by anodization in an electrolyte at a low voltage; removing the second metal layer; forming the capacitor counter electrode and a second interconnect conductor pattern by depositing a third metal layer (19,20) and etching selected areas; and stabilizing said resistor and capacitor by heating the resulting structure in an atmosphere comprising steam at high pressure.

2. The method according to claim 1 wherein the first metal layer comprises alpha tantalum and the resistive material comprises tantalum nitride.

3. The method according to claim 1 wherein a portion of the first metal layer is also defined over said ohmic contacts.

4. The method according to claim 1 wherein the second metal layer comprises titanium.

5. The method according to claim 1 wherein the third metal layer comprises successive layers of nickel-chromium and gold.

6. The method according to claim 1 wherein the voltage applied for anodization is less than 100 volts.

7. The method according to claim 1 wherein the resistors and capacitors are stabilized at a temperature in the range 250-350 degrees C. for a time of ½2 hours in a pressure of 700–1200 psi.

8. The method according to claim 1 wherein beam leads (22) are formed around the periphery of said circuit by plating selected areas of said third metal layer.

9. The method according to claim 1 wherein the resistors are defined by plasma etching.

10. The method according to claim 1 wherein the insulating layer comprises successive layers of $SiO_2$ and $Si_3N_4$ and the capacitor is formed on the $Si_3N_4$ layer while the resistor is formed on an area of $SiO_2$ not covered by said $Si_3N_4$ layer.

11. The method according to claim 1 wherein the ohmic contacts comprise platinum silicide.

12. A method for fabricating thin film resistor (16) and capacitor (23) components on an insulating layer (11,12) formed over a silicon substrate (10) where said substrate includes active devices (13) formed therein and platinum silicide ohmic contacts (14) to said devices characterized in the steps of defining a capacitor anode (15') and a protective covering (15") for the ohmic contacts selectively on said insulating layer from a first metal layer comprising alpha tantalum; depositing a layer of resistive material comprising tantalum nitride over the resulting structure and defining a resistor (16) in a selected area; forming a mask (17) and a first interconnect pattern (17') for selective oxidation of the capacitor anode by depositing a second metal layer comprising titanium and chemically etching selected areas; forming a dielectric (18) on the capacitor anode by anodization in an electrolyte at a voltage of less than 100 volts; removing the titanium with an etchant which does not affect the tantalum and the dielectric; forming the capacitor counter electrode (20') and a second interconnect conductor pattern (20''') between the resistor and capacitor and the active semiconductor device by depositing successive layers of nickel-chromium (19) and gold (20) and chemically etching selected areas; and stabilizing said resistor and capacitor by heating the resulting structure in an atmosphere comprising steam at a temperature of 250-350 degrees C. for a time of ½2 hours at a pressure of 700–1200 psi.

* * * * *